(12) United States Patent
Cho et al.

(10) Patent No.: US 8,664,757 B2
(45) Date of Patent: Mar. 4, 2014

(54) HIGH DENSITY CHIP STACKED PACKAGE, PACKAGE-ON-PACKAGE AND METHOD OF FABRICATING THE SAME

(75) Inventors: Yun-Rae Cho, Seoul (KR); Kun-Dae Yeom, Cheonan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 328 days.

(21) Appl. No.: 13/162,846

(22) Filed: Jun. 17, 2011

(65) Prior Publication Data

US 2012/0007227 A1   Jan. 12, 2012

(30) Foreign Application Priority Data

Jul. 12, 2010   (KR) .................. 10-2010-0067035

(51) Int. Cl.
*H01L 29/66* (2006.01)
(52) U.S. Cl.
USPC ............................ 257/686; 257/678; 257/687
(58) Field of Classification Search
USPC ......................................... 257/686, 687, 678
IPC .................................................. H01L 25/0657
See application file for complete search history.

(56) References Cited

U.S. PATENT DOCUMENTS

| 7,635,913 | B2 | 12/2009 | Kim et al. | |
|---|---|---|---|---|
| 2007/0194462 | A1* | 8/2007 | Kim et al. | 257/787 |
| 2007/0246842 | A1 | 10/2007 | Takayanagi et al. | |
| 2008/0136006 | A1 | 6/2008 | Jang et al. | |

FOREIGN PATENT DOCUMENTS

| JP | 2007-294488 | 11/2007 |
|---|---|---|
| JP | 2008-147669 | 6/2008 |
| JP | 2008-147670 | 6/2008 |
| KR | 10-2007-0104236 | 10/2007 |
| KR | 10-2008-0053233 | 6/2008 |
| KR | 10-2008-0053234 | 6/2008 |

* cited by examiner

*Primary Examiner* — Eva Yan Montalvo
(74) *Attorney, Agent, or Firm* — Stanzione & Kim, LLP

(57) ABSTRACT

A semiconductor package including a protection layer, a plurality of semiconductor chips stacked on the protection layer, an inner encapsulant disposed on the protection layer to surround side surfaces of the semiconductor chips, and a terminal disposed to be buried in an upper portion of the inner encapsulant. Herein, each of the semiconductor chips includes an active surface, an inactive surface opposite to the active surface, and a chip pad disposed on a portion of the active surface, and an upper surface of the terminal is exposed from an upper surface of the inner encapsulant.

17 Claims, 15 Drawing Sheets

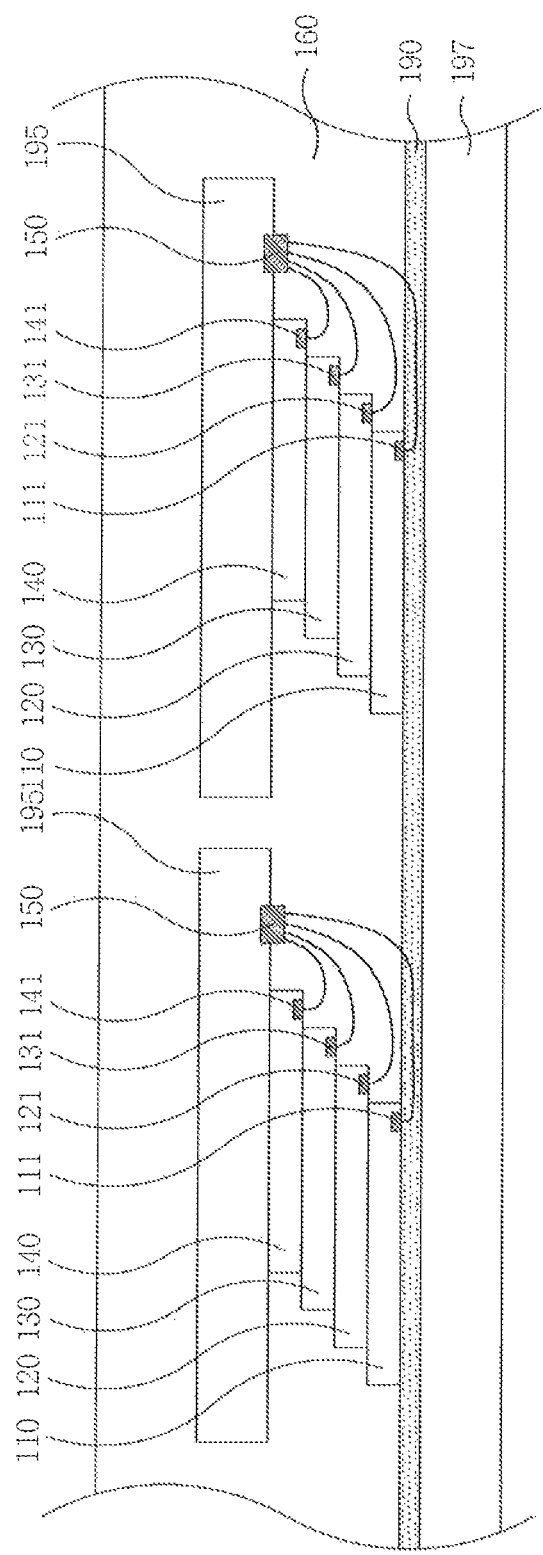

HIGH DENSITY CHIP STACKED PACKAGE, PACKAGE-ON-PACKAGE AND METHOD OF FABRICATING THE SAME

CROSS-REFERENCE TO RELATED APPLICATIONS

This application claims priority under 35 U.S.C. §119(a) from Korean Patent Application No. 10-2010-0067035 filed on Jul. 12, 2010, the disclosure of which is hereby incorporated by reference in its entirety.

BACKGROUND OF THE INVENTION

1. Field of the Invention

Embodiments of the present general inventive concept relate to a semiconductor package with a plurality of semiconductor chips stacked, a package-on-package with a plurality of unit semiconductor packages stacked, and a method of fabricating the same.

2. Description of the Related Art

Electronic appliances are becoming thinner and lighter according to demand from users together with the development of semiconductor technologies. According to this, in order to increase processing capacity or storage capacity of semiconductor devices, research on the increase of integration density of semiconductor devices has been progressing. Package techniques that embody homogeneous or heterogeneous semiconductor chips as a unit package have been suggested. Further, package-on-package techniques in which a plurality of packages are vertically stacked to operate in one system have been suggested.

SUMMARY OF THE INVENTION

Embodiments of the present general inventive concept can provide a semiconductor package with a plurality of semiconductor chips stacked.

Embodiments of the present general inventive concept can provide a package-on-package.

Embodiments of the present general inventive concept can provide a method of fabricating a semiconductor package and a package-on-package.

Embodiments of the present general inventive concept can provide an electronic system including a package-on-package.

Additional features and utilities of the present general inventive concept will be set forth in part in the description which follows and, in part, will be obvious from the description, or may be learned by practice of the general inventive concept.

Exemplary embodiments of the present general inventive concept may provide a semiconductor package including a protection layer, a plurality of semiconductor chips stacked on one another, with the stack disposed on the protection layer, an inner encapsulant disposed on the protection layer to surround side surfaces of the semiconductor chips, and a terminal disposed to be buried in an upper portion of the inner encapsulant. Each of the plurality of semiconductor chips can include an active surface, an inactive surface, and a chip pad disposed on a portion of the active surface. An upper surface of the terminal can be exposed from an upper surface of the inner encapsulant.

Exemplary embodiments of the present general inventive concept may also provide a package-on-package that can include a substrate including substrate pads, a plurality of unit semiconductor packages stacked on one another, with the stack disposed on the substrate, and an outer encapsulant surrounding side surfaces of the unit semiconductor packages. Each of the plurality of unit semiconductor packages includes a protection layer, a plurality of semiconductor chips stacked on one another, with the stack disposed on the protection layer, an inner encapsulant disposed on the protection layer to surround side surfaces of the semiconductor chips, and a terminal disposed to be buried in an upper portion of the inner encapsulant. Each of the plurality of semiconductor chips can include an active surface, an inactive surface opposite to the active surface, and a chip pad disposed on a portion of the active surface. An upper surface of the terminal can be exposed from an upper surface of the inner encapsulant.

Exemplary embodiments of the present general inventive concept may also provide an electronic system that can include an input/output (I/O) device and a semiconductor package disposed adjacent to the I/O device and electrically connected to the I/O device. The semiconductor package can include a protection layer, a plurality of semiconductor chips stacked on the protection layer, an inner encapsulant disposed on the protection layer to surround side surfaces of the semiconductor chips, and a terminal disposed to be buried in an upper portion of the inner encapsulant. Each of the plurality of semiconductor chips can include an active surface, an inactive surface, and a chip pad disposed on a portion of the active surface. An upper surface of the terminal can be exposed from an upper surface of the inner encapsulant.

Exemplary embodiments of the present general inventive concept may also provide a method of fabricating a semiconductor package that can include stacking semiconductor chips having chip pads on a first substrate having terminals, electrically connecting the chip pads of the semiconductor chips and the terminals, turning the first substrate over to adhere to a protection layer included in a supporter, forming an inner encapsulant on the supporter, exposing upper surfaces of the terminals from an upper surface of the inner encapsulant, separating a stack structure of the semiconductor chips by a singulation process, and detaching the supporter from the protection layer.

Exemplary embodiments of the present general inventive concept may also provide a semiconductor package including a protection layer, a plurality of semiconductor chips, each having a chip pad, where the plurality of semiconductor chips are stacked on one another so that the chip pads of each respective semiconductor device are exposed, with the stack of the plurality of semiconductors disposed on the protection layer, and where bonding wires electrically connect the chip pads to a terminal that is exposed on an outer surface of the semiconductor package.

The semiconductor package may also include an encapsulant disposed on the protection layer to cover at least one surface of the plurality of semiconductor chips.

The semiconductor package may also include where each of the semiconductor chips includes an active surface, an inactive surface opposite to the active surface, and the chip pads of each of the plurality of semiconductor devices are disposed on a portion of the active surface.

The semiconductor package may also include where the active surface of a first semiconductor chip of the plurality of semiconductor chips in the stack is in contact with the protection layer.

Exemplary embodiments of the present general inventive concept may also provide a package-on-package, including substrate including substrate pads, a plurality of unit semiconductor packages stacked on one another, with the stack disposed on the substrate, the unit semiconductor packages having a protection layer, a plurality of semiconductor chips, each having a chip pad, where the plurality of semiconductor chips are stacked on one another so that the chip pads of each respective semiconductor device are exposed, with the stack of the plurality of semiconductors disposed on the protection layer, and where bonding wires electrically connect the chip pads to a terminal that is exposed on an outer surface of the semiconductor package, and an outer encapsulant surrounding at least one surface of the unit semiconductor packages.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIGS. 10A to 10J are cross-sectional views illustrating a fabrication method according to the fabrication method illustrated in FIG. 9.

DETAILED DESCRIPTION OF THE PREFERRED EMBODIMENTS

Figure 1:
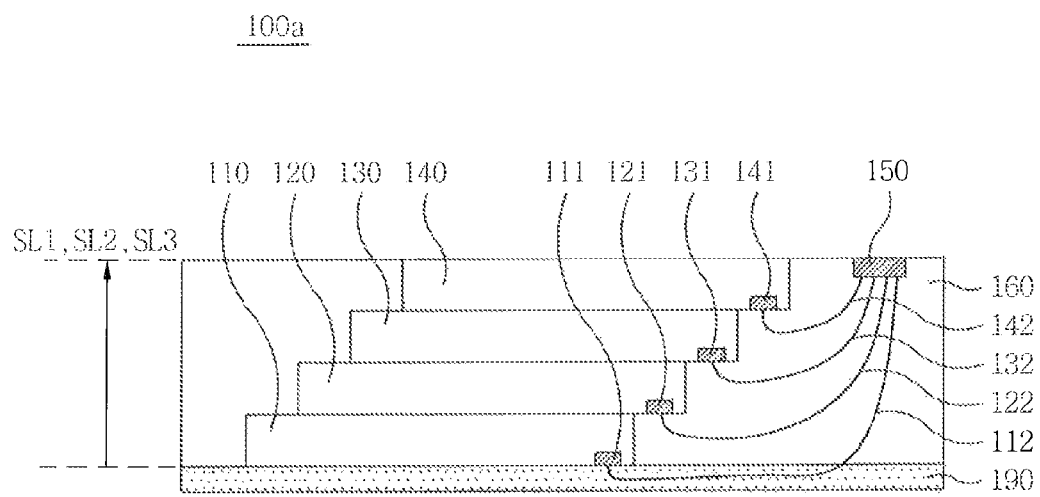
FIGS. 1 to 5 are cross-sectional views illustrating semiconductor packages in accordance with exemplary embodiments of the present general inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are schematic cross-sectional views illustrating semiconductor packages in accordance with exemplary embodiments of the present general inventive concept.

Referring to FIG. 1, a semiconductor package 100a of the present general inventive concept may include a protection layer 199 and a plurality of semiconductor chips 110, 120, 130, and 140 stacked on the protection layer 190. The semiconductor package 100a may include an inner encapsulant 160 disposed on the protection layer 190 to surround at least one side surface of the semiconductor chips 110, 120, 130, and 140 and terminals 150 disposed to be buried in an upper portion of the inner encapsulant 160.

Although there is no limit to the number of semiconductor chips mounted in the semiconductor package 100a, four semiconductor chips 110, 120, 130, and 140 will be illustratively explained to be mounted in the semiconductor package 100a. The lowermost semiconductor chip 110 of the semiconductor chips may be stacked so as to contact (e.g., to be in direct contact with) the protection layer 190, and the remaining semiconductor chips 120, 130, and 140 may be sequentially stacked on the lowermost semiconductor chip 110. Upper semiconductor chips (e.g., semiconductor chips 120, 130 and 140 that are stacked on one another, with the stack disposed on the semiconductor chip 110) of the semiconductor chips 110, 120, 130, and 140 may be stacked to expose at least portions of surfaces of lower semiconductor chips. For example, the semiconductor chips 110, 120, 130, and 140 may be stacked so as to be staggered in a cascade stack structure. However, the present general inventive concept is not limited to the cascade stack structure of the following description.

The protection layer 190 may protect the semiconductor chips 110, 120, 130, and 140 and simultaneously have double-sided adhesion. One side of the protection layer 190 may be in contact with the lowermost semiconductor chip 110, and the other side of the protection layer 190 may be in contact with an uppermost semiconductor chip of another semiconductor package (not illustrated) which is to be disposed below the semiconductor package 100a. The one side of the protection layer 190 may adhere to the lowermost semiconductor chip 110 and the other side of the protection layer 190 may adhere to a package-on-package substrate (not illustrated).

The protection layer 190 may include a polyimide film. The protection layer 190 may have double-sided adhesion. The protection layer 190 may not include a base film so as to have adhesion and a minimal thickness. The protection layer 190 may be formed by drying or hardening a tape-type material or a paste-type material, or by drying or hardening a film-type material.

The protection layer 190 may have a thickness of 50 to 150 μm. If the thickness of the protection layer 190 exceeds 150 μm, it can increase the thickness of the semiconductor package 100a or the thickness of a package-on-package as described in detail below to reduce an integration density of the semiconductor device. When the thickness of the protection layer 190 is less than 50 μm, the protection of the semiconductor chips 110, 120, 130, and 140 from external shock or pressure applied in a fabrication process may decrease and/or may be reduced. For example, when the protection layer 190 is less than 50 μm, the protection layer 190 may not provide a sufficient space to bury at least portions of bonding wires.

The semiconductor chips 110, 120, 130, and 140 may be homogeneous or heterogeneous. The semiconductor chips 110, 120, 130, and 140 may include random access memory (RAM) chips, flash memory chips, phase change memory chips, magnetic RAM (MRM) chips, resistive memory chips, or a combination thereof.

Each of the semiconductor chips 110, 120, 130, and 140 may include a plurality of chip pads 111, 121, 131, and 141. The chip pads 111, 121, 131, and 141 may be formed of a conductive material. The chip pads 111, 121, 131, and 141 may include a metal such as Au, Ag, Cu, Ni, Al, Sn, Pb, Pt, Bi, In, etc.

The chip pads 111, 121, 131, and 141 may be formed such that upper surfaces thereof are lower than or level with the surfaces of the semiconductor chips 110, 120, 130, and 140, as illustrated. Alternatively, the chip pads 111, 121, 131, and 141 may be formed such that the upper surfaces thereof protrude from the surfaces of the semiconductor chips 110, 120, 130, and 140. As illustrated, when the semiconductor chips 110, 120, 130, and 140 are stacked such that the chip pads 111, 121, 131, and 141 are disposed on the exposed portions of the semiconductor chips 110, 120, 130, and 140, or such that the sides of the semiconductor chips 110, 120, 130, and 140 are staggered, for example, when the semiconductor chips 110, 120, 130, and 140 are stacked in a cascade pattern or in a staggered zigzag pattern, the protruding chip pads 111, 121, 131, and 141 may not affect the stacking of the semiconductor chips 110, 120, 130, and 140.

The chip pads 111, 121, 131, and 141 may be disposed on portions of active surfaces of the semiconductor chips 110, 120, 130, and 140. The chip pads 111, 121, 131, and 141 may be disposed on the outer portions of the semiconductor chips 110, 120, 130, and 140, respectively. To do this, redistribution layers may be disposed on the active surfaces.

The semiconductor package 100a of the present general inventive concept may further include terminals 150. The terminals 150 can input and output electrical signals to and from the semiconductor chips 110, 120, 130, and 140 and the following package-on-package substrate. The terminals 150 may be formed of a conductive material. For example, the terminals 150 may include a metal such as Au, Ag, Cu, Ni, Al, Sn, Pb, Pt, Bi, In, etc.

The terminals 150 may be electrically connected to the semiconductor chips 110, 120, 130, and 140 by bonding wires 112, 122, 132, and 142, respectively. An inactive surface of the uppermost semiconductor chip 140 out of the semiconductor chips 110, 120, 130, 140 and upper surfaces of the terminals 150 may be partially or entirely exposed. Specifically, parts or wholes of the inactive surface of the uppermost semiconductor chip 140 and the upper surfaces of the terminals 150 may not be encapsulated with the inner encapsulant 160. Herein, the inactive surface may be a surface facing the active surface. Surface levels SL2 of the terminals 150 may be level with a surface level SL1 of the uppermost semiconductor chip 140. The surface level SL1 of the uppermost semiconductor chip 140 may be level with a surface level SL3 of the inner encapsulant 160. Herein, the surface level may be a height of the semiconductor chips in the stack direction on the basis of the upper surface of the protection layer 190. For example, the surface level SL1 of the uppermost semiconductor chip 140 may be a height from the upper surface of the protection layer 190 to the inactive surface of the uppermost semiconductor chip 140.

The chip pads 111, 121, 131, and 141 disposed on the portions of the semiconductor chips 110, 120, 130, and 140 and the terminals 150 may be electrically connected by the bonding wires 112, 122, 132, and 142, respectively. The chip pads 111 of the lowermost semiconductor chip 110 may be electrically connected to the terminals 150 by the first bonding wires 112, and the chip pads 121 and 131 of the semiconductor chips 120 and 130 which are sequentially stacked on the lowermost semiconductor chip 110 may be electrically connected to the terminals 150 by the second and third bonding wires 122 and 132, respectively. Similarly, the chip pads 141 of the uppermost semiconductor chip 140 may be electrically connected to the terminals 150 by the fourth bonding wires 142. The bonding wires 112, 122, 132, and 142 may include Au wires. In particular, each of the bonding wires 112, 122, 132, and 142 may be directly connected to the terminals 150. Portions of the first bonding wires 112 may be buried in the protection layer 190.

The inner encapsulant 160 can be disposed on the protection layer 190. The inner encapsulant 160 may encapsulate the side surfaces of the semiconductor chips 110, 120, 130, and 140, the bonding wires 112, 122, 132, and 142 and portions or all of the terminals 150. The inner encapsulant 160 may be disposed on the protection layer 190. The inner encapsulant 160 may protect the semiconductor chips 110, 120, 130, and 140 as well as the bonding wires 112, 122, 132, and 142 from external shock. For example, the inner encapsulant 160 may include an epoxy molding compound (EMC). The inner encapsulant 160 may be formed by a conventional injection molding process. The inner encapsulant 160 may be formed of a different material from the protection layer 190.

The lowermost semiconductor chip 110 may be stacked such that the active surface of lowermost semiconductor chip 110 is in contact with the protection layer 190. The semiconductor chips 120 and 130 between the lowermost and uppermost semiconductor chips 110 and 140 may be stacked in a cascade pattern, respectively. The active surfaces of the semiconductor chips 120 and 130 stacked between the lowermost and uppermost semiconductor chips 110 and 140 and the active surface of the uppermost semiconductor chip 140 may be in contact with the inactive surfaces of the lower semiconductor chips 110, 120 and 130, respectively. There may be no mold gaps occupied by the inner encapsulant 160 between the semiconductor chips 110, 120, 130, and 140. The thickness of the semiconductor package 100a according to exemplary embodiments of the present general inventive concept can be minimized, and thus the number of semiconductor chips mounted in the constant mount area can be increased. Accordingly, the semiconductor package of the present general inventive concept may have increased chip density.

Figure 2:
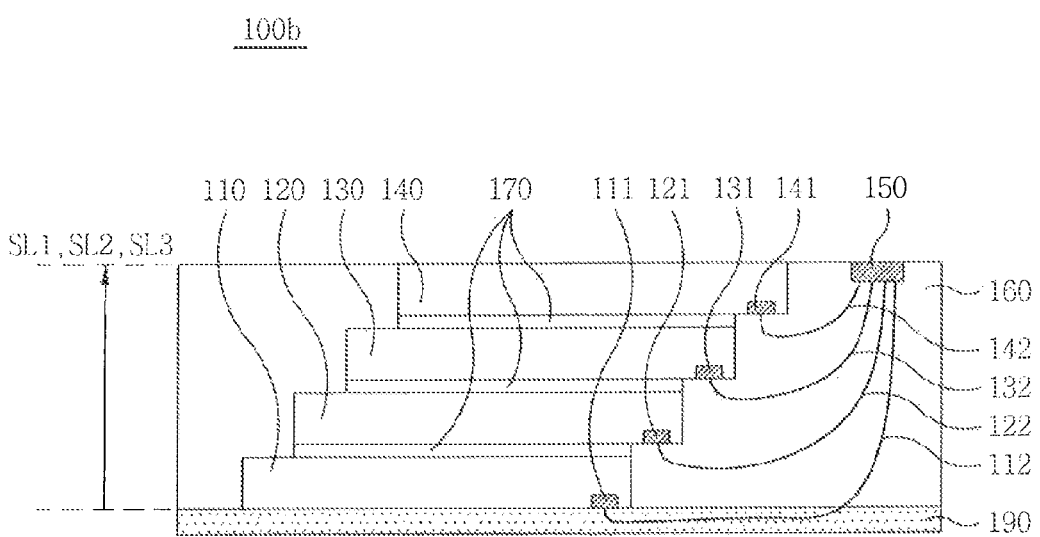

FIG. 2 is a cross-sectional view illustrating a semiconductor package 100b according to exemplary embodiments of the present general inventive concept. The description of portions of the semiconductor package 100b which are the same as those of the semiconductor package 100a as illustrated in FIG. 1 will be omitted. Accordingly, if there is no special mention, the description of the semiconductor package 100a as illustrated in FIG. 1 may be adapted as it is.

Referring to FIG. 2, the semiconductor package 100b according to exemplary embodiments of the present general inventive concept may include adhesion layers 170 between semiconductor chips 110, 120, 130, and 140.

An active surface of a lowermost semiconductor chip 110 may be in contact with the protection layer 190. The protection layer 190 may include a polyimide film. In order to have double-sided adhesion and to minimize thickness, the protection layer 190 may be a tape-type without a base film, or may be a paste-type.

The adhesion layers 170 may include a non-conductive film (NCF), an anisotropic conductive film (ACF), a die bonding tape, a non-conductive paste (NCP) or a combination thereof.

An inactive surface of the uppermost semiconductor chip 140 and upper surfaces of the terminals 150 may not be encapsulated by an inner encapsulant 160, and thus may be exposed. Surface levels SL2 of the terminals 150 may be level with a surface level SL1 of the uppermost semiconductor chip 140. The inactive surface of the uppermost semiconductor chip 140 and the upper surfaces of the terminals 150 being exposed is such that the surface level SL1 of the uppermost semiconductor chip 140 is level with a surface level SL3 of the inner encapsulant 160.

The semiconductor package 100b of the present general inventive concept as illustrated in FIG. 2 may have no molding gaps between the protection layer 190 and the semiconductor chip 110 or between the semiconductor chips 110, 120, 130, and 140 due to the inner encapsulant 160. That is, the inner encapsulant 160 may fill any gaps between the protection layer 190 and the semiconductor chip 110, and/or may fill any gaps between the semiconductor chips 110, 120, 130, and 140. The semiconductor chips can be mounted so as to increase the density of the semiconductor package.

Figure 3:
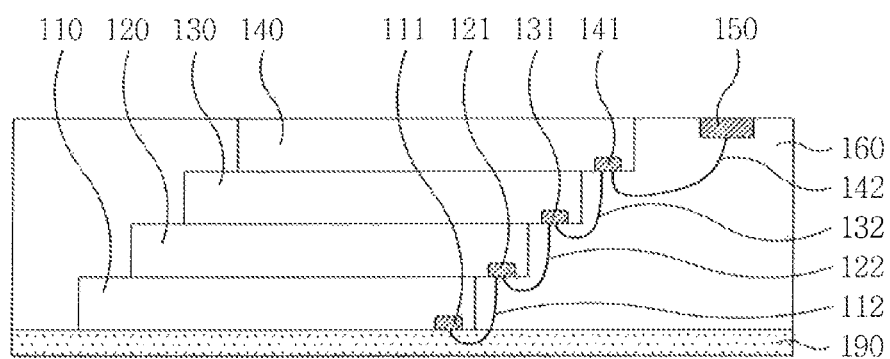

FIG. 3 is a cross-sectional view illustrating a semiconductor package 100c according to exemplary embodiments of the present general inventive concept. The description of portions of the semiconductor package 100c which are the same as those of the semiconductor package 100a as illustrated in FIG. 1 will be omitted. Accordingly, if there is no special mention, the description of the semiconductor package 100a as illustrated in FIG. 1 may be adapted as it is.

Referring to FIG. 3, bonding wires 112, 122, 132, and 142 may be included in the semiconductor package 100c of the present general inventive concept to electrically connect upper semiconductor chips with lower semiconductor chips, respectively. The first bonding wires 112 may electrically connect a lowermost semiconductor chip 110 and a semiconductor chip 120 stacked adjacent to the lowermost semiconductor chip 110. The uppermost semiconductor chip 140 and the terminals 150 may be electrically connected by the fourth bonding wires 142.

As described above in connection with FIG. 2, adhesion layers to adhere semiconductor chips 110, 120, 130, and 140 may be disposed between the semiconductor chips 110, 120, 130, and 140.

Figure 4:
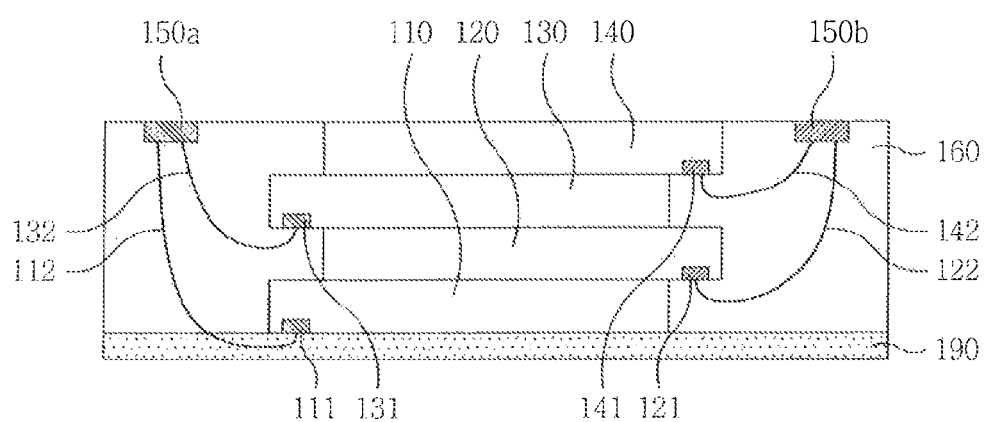

FIG. 4 is a cross-sectional view illustrating a semiconductor package 100d according to exemplary embodiments of the present general inventive concept. The description of portions of the semiconductor package 100d which are the same as those of the semiconductor package 100a as illustrated in FIG. 1 will be omitted. Accordingly, if there is no special mention, the description of the semiconductor package 100a as illustrated in FIG. 1 may be adapted as it is.

Referring to FIG. 4, semiconductor chips 110, 120, 130, and 140 included in the semiconductor package 100d according to the present general inventive concept may be stacked in a staggered zigzag pattern.

The semiconductor chips 120 and 130 which may be stacked between the lowermost semiconductor chip 110 and the uppermost semiconductor chip 140. Chip pads 111, 121, 131, and 141 may be disposed on portions of active surfaces of the semiconductor chips 110, 120, 130, and 140, respectively. The chip pads 121, 131, and 141 may be on exposed portions of the lower semiconductor chips 120, 130, and 140, respectively. For example, as illustrated in FIG. 4, when the first chip pads 111 may be disposed along a left edge of the active surface of the lowermost semiconductor chip 110, the second chip pads 121 may be disposed along a right edge of the active surface of the semiconductor chip 120 stacked adjacent to the lowermost semiconductor chip 110. Similarly, the fourth chip pads 141 may be disposed along a right side of the active surface of the uppermost semiconductor chip 140. The chip pads 141 may be formed to be arranged symmetrically with each other. Third chip pads 131 may be disposed along a left side of the active surface of the semiconductor chip 130. The chip pads 130 may be formed to be arranged symmetrically with the first chip pads 111 of the lowermost semiconductor chip 110.

The semiconductor package 100d may include first terminals 150a and second terminals 150b. Referring to FIG. 4, the chip pads 111 of the lowermost semiconductor chip 110 and the chip pads 131 of one 130 of the middle semiconductor chips 120 and 130 may be electrically connected to the first terminals 150a by bonding wires 112 and 132. The chip pads 121 of the other 120 of the middle semiconductor chips 120 and 130 and the chip pads 141 of the uppermost semiconductor chip 140 may be electrically connected to the second terminals 150b by bonding wires 122 and 142. At least portions of the bonding wires 112 which electrically connect the chip pads 111 of the lowermost semiconductor chip 110 and the first terminals 150a may be buried in the protection layer 190.

The inner encapsulant 160 may partially or entirely expose an inactive surface of the uppermost semiconductor chip 140 and surfaces of the first and second terminals 150a and 150b. Accordingly, a surface level of the uppermost semiconductor chip 140 may be level with surface levels of the first and second terminals 150a and 150b and/or a surface level of the inner encapsulant 160.

Figure 5:
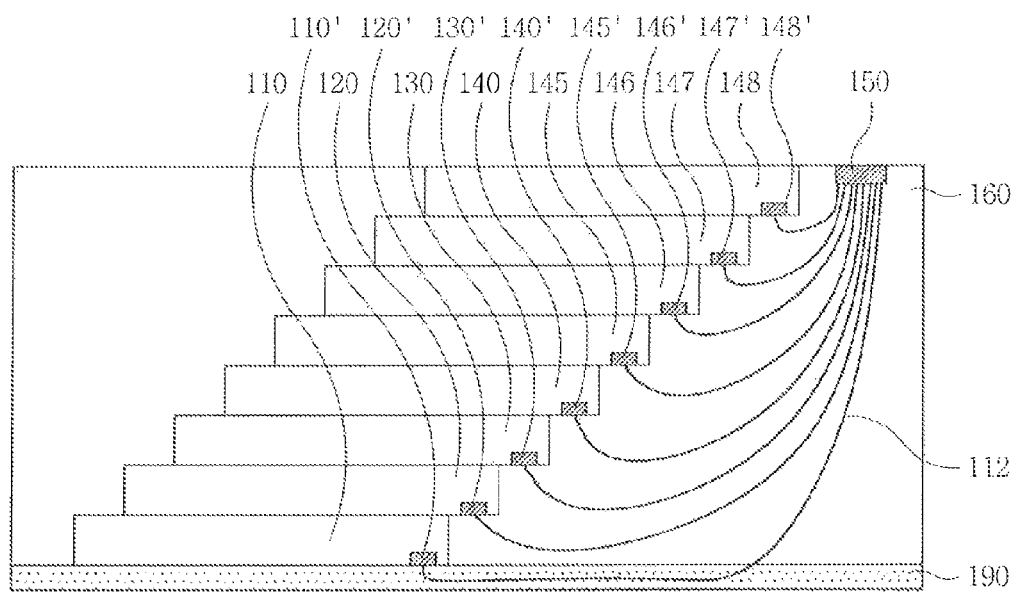

FIG. 5 is a cross-sectional view illustrating a semiconductor package 100e according to exemplary embodiments of the present general inventive concept. The description of portions of the semiconductor package 100e which are the same as those of the semiconductor package 100a as illustrated in FIG. 1 will be omitted. Accordingly, if there is no special mention, the description of the semiconductor package 100a as illustrated in FIG. 1 may be adapted as it is.

Referring to FIG. 5, the semiconductor package 100e according to exemplary embodiments of the present general inventive concept may include eight sequentially stacked semiconductor chips 110, 120, 130, 140, 145, 146, 147, and 148. A plurality of semiconductor chips may be disposed between the lowermost semiconductor chip 110 and the uppermost semiconductor chip 148. The semiconductor chips 110, 120, 130, 140, 145, 146, 147, and 148 may include chip pads 110', 120', 130', 140', 145', 146', 147', and 148' disposed at least on portions thereof, respectively. The chip pads 110', 120', 130', 140', 145', 146', 147', and 148' may be electrically connected to terminals 150 by bonding wires, respectively. At least portions of the bonding wires 112 which connect the lowermost semiconductor chip 110 and the terminals 150 may be buried in the protection layer 190. Adhesion layers to adhere the semiconductor chips may be disposed between the semiconductor chips 110, 120, 130, 140, 145, 146, 147, and 148.

Figure 6A:
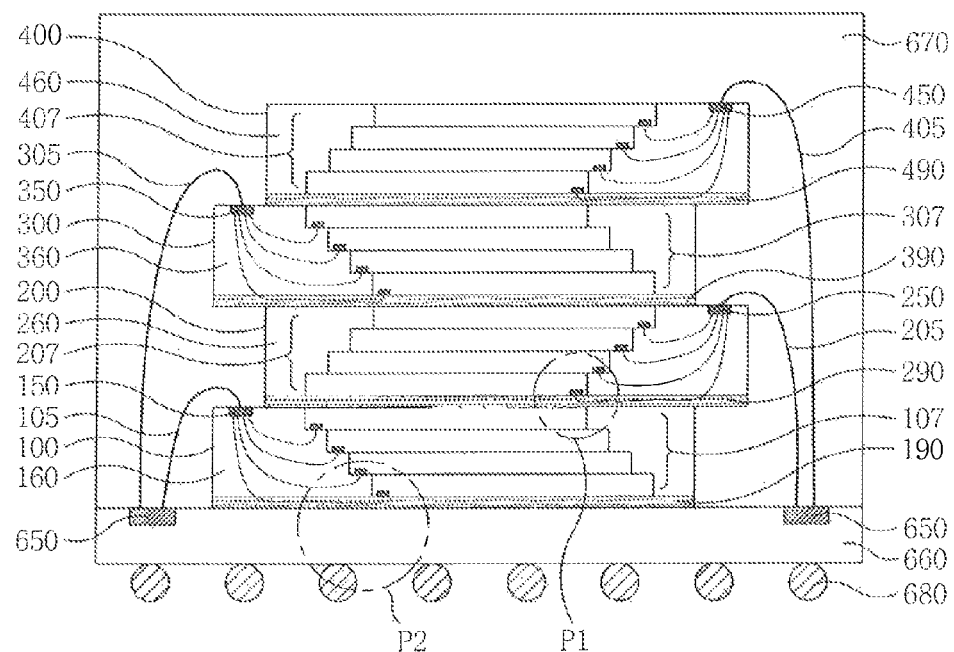
FIG. 6A is a cross-sectional view illustrating a package-on-package in accordance with exemplary embodiments of the present general inventive concept.
Figure 7:
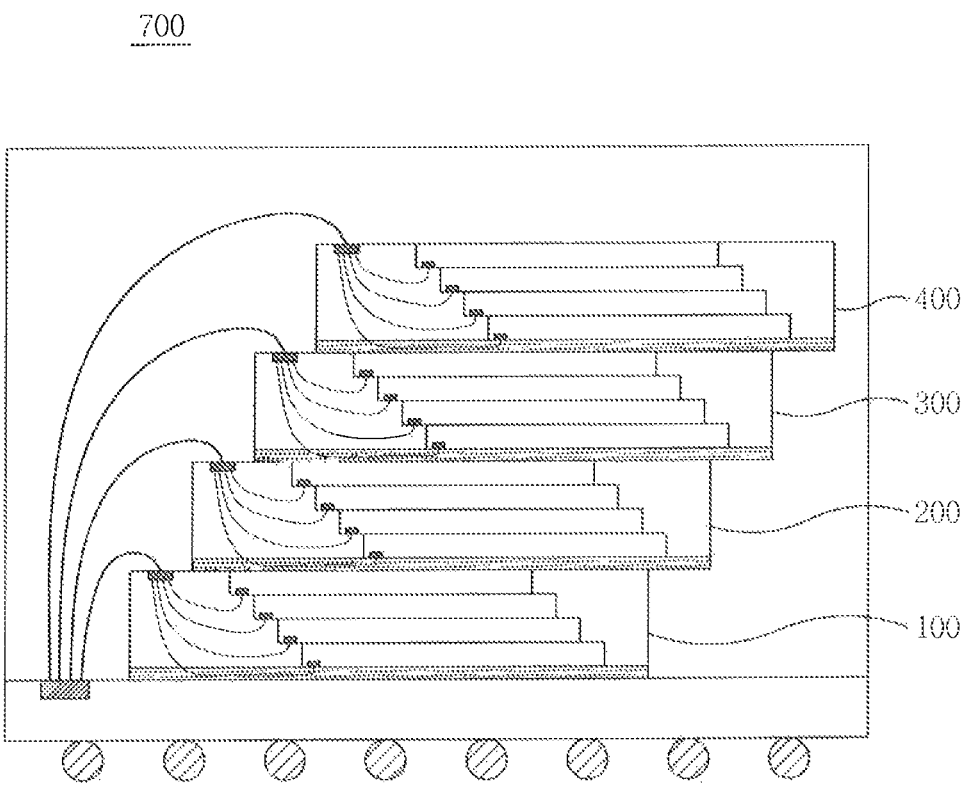
FIGS. 7 and 8 are cross-sectional views illustrating package-on-packages in accordance with exemplary embodiments of the present general inventive concept.

FIGS. 6A and 7 are cross-sectional views illustrating package-on-packages in which a plurality of semiconductor packages 100a, 100b, 100c, 100d, and 100e are vertically stacked as a unit package according to exemplary embodiments of the present general inventive concept. FIG. 6A illustrates four unit packages stacked in a staggered zigzag pattern, and FIG. 7 illustrates four unit packages stacked in a cascade pattern. Although FIGS. 6A and 7 illustrate four stacked unit semiconductor packages, the number of stacked unit semiconductor packages is not limited thereto. The package-on-package according to exemplary embodiments of the present general inventive concept may use the unit semiconductor packages 100a, 100b, 100c, 100d, and 100e as illustrated in FIGS. 1 to 5 as unit semiconductor packages, but the general inventive concept is not limited thereto and hereinafter, the semiconductor package 100a of FIG. 1 will be exemplarily explained.

Referring to FIG. 6A, a package-on-package 600 can include a substrate 660, a plurality of unit semiconductor packages 100, 200, 300, and 400, and an outer encapsulant 670 filled around the unit semiconductor packages 100, 200, 300, and 400.

Each of the unit semiconductor packages 100, 200, 300, and 400 may include a protection layer 190, 290, 390, and 490, a plurality of semiconductor chips 107, 207, 307, and 407 stacked on the protection layer 190, 290, 390, and 490, an inner encapsulant 160, 260, 360, and 460 disposed on the protection layer 190, 290, 390, and 490 to at least partly surround the side surfaces of the semiconductor chips 107, 207, 307, and 407, and terminals 150, 250, 350, and 450 disposed so as to be at least partially buried in the inner encapsulant 160, 260, 360, and 460.

Each of the semiconductor chips 107, 207, 307, and 407 may include at least one of a dynamic random access memory (DRAM) chip, a flash memory chip, a phase change memory chip, a magnetic RAM (MRAM) chip, and a resistive memory chip.

The substrate 660 may include at least one of a rigid printed circuit board (PCB), a flexible PCB, a rigid flexible PCB, a tape distribution substrate, a ceramic substrate, and a combination thereof. The substrate 660 may include substrate pads 650. The substrate pads 650 may include a conductive material. The substrate pads 650 may include a metal such as Au, Ag, Cu, Ni, Al, Sn, Pb, Pt, Bi, In, etc.

FIG. 6A illustrates that the unit semiconductor packages 100, 200, 300, and 400 can be disposed in a staggered zigzag pattern such that the terminals 150, 250, 350, and 450 of the unit semiconductor packages 100, 200, 300, and 400 may be exposed. The exposed terminals 150, 250, 350, and 450 may be electrically connected to the substrate pads 650 by bonding wires 105, 205, 305, and 405, respectively. The bonding wires 105, 205, 305, and 405 may include Au wires.

The substrate 660 may include external terminals 680 on another surface thereof which is opposite to one side thereof on which the unit semiconductor packages 100, 200, 300, and 400 are stacked. The external terminals 680 may receive electrical signals from the outside or output the processed signals to the outside. For example, the external terminals 680 may include at least one of a solder ball, a conductive bump, a conductive tap, a conductive pin, a conductive lead and a combination thereof. FIG. 6A illustrates solder balls as the external terminals 680.

The package-on-package 600 may include the outer encapsulant 670. It will be understood that the word "outer" is an expression to distinguish from the "inner" encapsulant 160, 260, 360, and 460 included in the unit semiconductor packages 100, 200, 300, and 400. The outer encapsulant 670 may protect the unit semiconductor packages 100, 200, 300, and 400 as well as the bonding wires 105, 205, 305, and 405 from external shock. For example, the outer encapsulant 670 may include an EMC. The outer encapsulant 670 may be formed by a conventional injection molding process.

The terminals 150, 250, 350, and 450 may be disposed on edges of upper portions of the unit semiconductor packages 100, 200, 300, and 400 in which the terminals 150, 250, 350, and 450 are included, respectively. The terminals 150, 250, 350, and 450 may have the same surface levels as the uppermost semiconductor chips of the unit semiconductor packages 100, 200, 300, and 400 in which the terminals 150, 250, 350, and 450 are included, respectively.

Figure 6B:
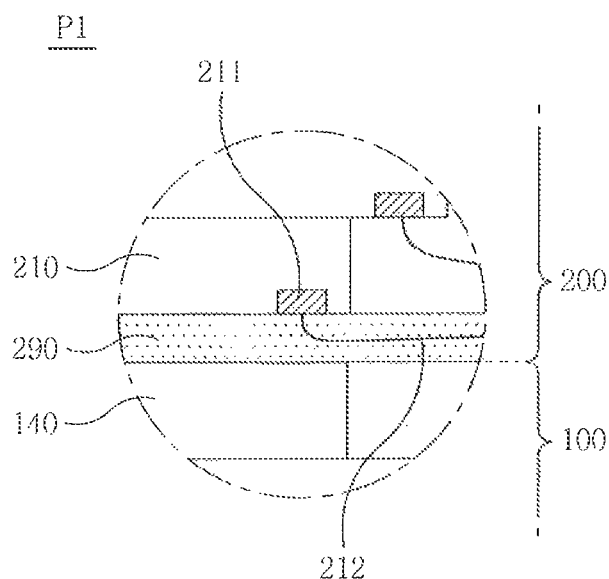
FIGS. 6B and 6C are enlarged views of portions P1 and P2 illustrated in FIG. 6A, respectively.
Figure 6C:
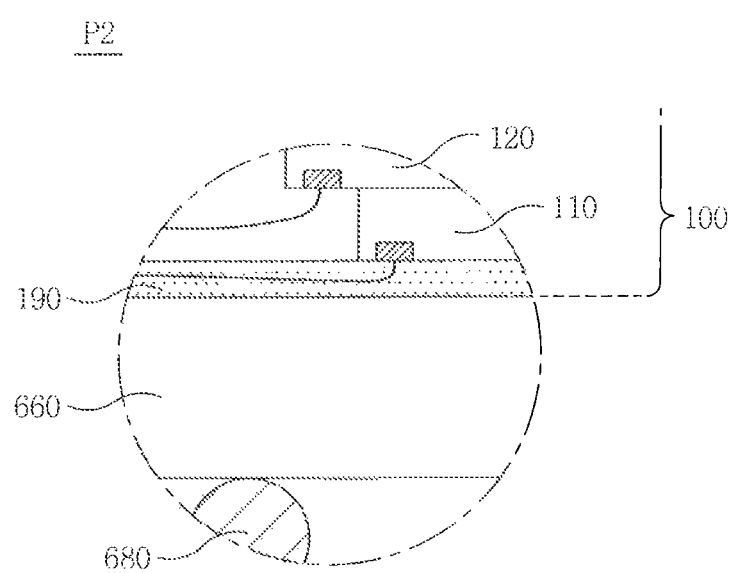

FIGS. 6B and 6C are enlarged views of a portion P1 and a portion P2 of FIG. 6A, illustrating the stacked unit semiconductor packages. That is, FIG. 6B illustrates the portion P1 of FIG. 6A, and FIG. 6C illustrates the portion P2 of FIG. 6A.

FIG. 6B illustrates an interface between the unit semiconductor packages 100, 200, 300, and 400, and FIG. 6C illustrates an interface between the lowermost unit semiconductor package 100 (hereinafter, referred to as a first unit semiconductor package) and the substrate 600.

Referring to FIG. 6B, the first unit semiconductor package 100 may include the uppermost semiconductor chip 140. The second unit semiconductor package 200 may be stacked adjacent onto the first unit semiconductor package 100. The second unit semiconductor package 200 may include the second protection layer 290 and the second lowermost semiconductor chip 210. The second protection layer 290 may include a polyimide film.

The second lowermost semiconductor chip 210 of the second unit semiconductor package 200 may be in contact with the second protection layer 290. Chip pads may be disposed on an active surface of each semiconductor chip (e.g., uppermost semiconductor chip 140 and the second lowermost semiconductor chip 210). One or more redistribution layers may be included so that chip pads may be formed thereof. A surface facing the active surface may be called an inactive surface. Herein, a surface which is in contact with an upper surface of the second protection layer 290 may be the active surface of the second lowermost semiconductor chip 210. The uppermost semiconductor chip 140 of the first unit semiconductor package 100 may be in contact with a lower surface of the second protection layer 290. Herein, a surface which is in contact with the lower surface of the second protection layer 290 may be an inactive surface of the uppermost semiconductor chip 140.

Each semiconductor chip may include chip pads on an outer portion of the active surface thereof. The chip pads may be electrically connected to the terminals disposed on each unit semiconductor package (e.g., semiconductor packages 100, 200, 300 and 400, as illustrated in FIG. 6A) by the bonding wires as described above. In particular, as illustrated in FIG. 6B, portions of the bonding wires 212 which electrically connect the chip pads 211 of the lowermost semiconductor chip 210 included in the unit semiconductor package 200 to the terminals 250 may be at least partially buried in the second protection layer 290.

Referring to FIG. 6C, the first unit semiconductor package 100 can include the lowermost semiconductor chip 110 and the protection layer 190. The lowermost semiconductor chip 110 may be in contact with the protection layer 190. Herein, an active surface of the lowermost semiconductor chip 110 may be in contact with an upper surface of the protection layer 190. A lower surface of the protection layer 190 may be in contact with an upper surface of the substrate 600. The substrate 600 may include the external terminals 680.

Referring to FIGS. 6A, 6B, and 6C, in the package-on-package 600 according to exemplary embodiments of the present general inventive concept, the protection layers 290, 390, and 490 of the unit semiconductor packages 200, 300, and 400 which are disposed relatively higher and the uppermost semiconductor chips (e.g., the uppermost semiconductor chip 140 in semiconductor package 100, as well as the uppermost semiconductor chips in unit semiconductor packages 200 and 300) which are disposed relatively lower may contact each other, respectively. That is, the protection layers 200, 300, and 400 may respectively contact the uppermost semiconductor chips in an adjacent unit semiconductor package in the stack of the unit semiconductor packages. The lowermost semiconductor chip 110 of the first unit semiconductor package 100 may be in direct or indirect contact with the substrate 660.

In exemplary embodiments of the present general inventive concept, there may be no molding gap in a stack structure from the substrate 660 to the fourth semiconductor package 400. In further detail, the inner encapsulants 160, 260, 360, and 460 included in each of the unit semiconductor packages 100, 200, 300, and 400 or the outer encapsulant 670 may be not interposed between the semiconductor chips 107, 207, 307, and 407 or between the unit semiconductor packages 100, 200, 300, and 400. The stack height of the unit semiconductor packages 100, 200, 300, and 400 can be minimized and the number of semiconductor chips mounted on the package-on-package 600 having the constant area can be increased so that capacity density and/or integration density of the package-on-package can increase. The unit semiconductor packages 100, 200, 300, and 400 may have exposed terminals 150, 250, 350, and 450, respectively. Accordingly, one or more performance tests may be performed in each unit semiconductor package unit to distinguish the individual failed packages and increase the yield.

FIG. 7 is a cross-sectional view illustrating a package-on-package 700 in which unit semiconductor packages 100, 200, 300, and 400 are stacked in a cascade pattern. Except for the stack pattern, the description of the package-on-package 700 may be the same as that described above in connection with the package-on-package 600, which is illustrated in FIG. 6A.

Figure 8:
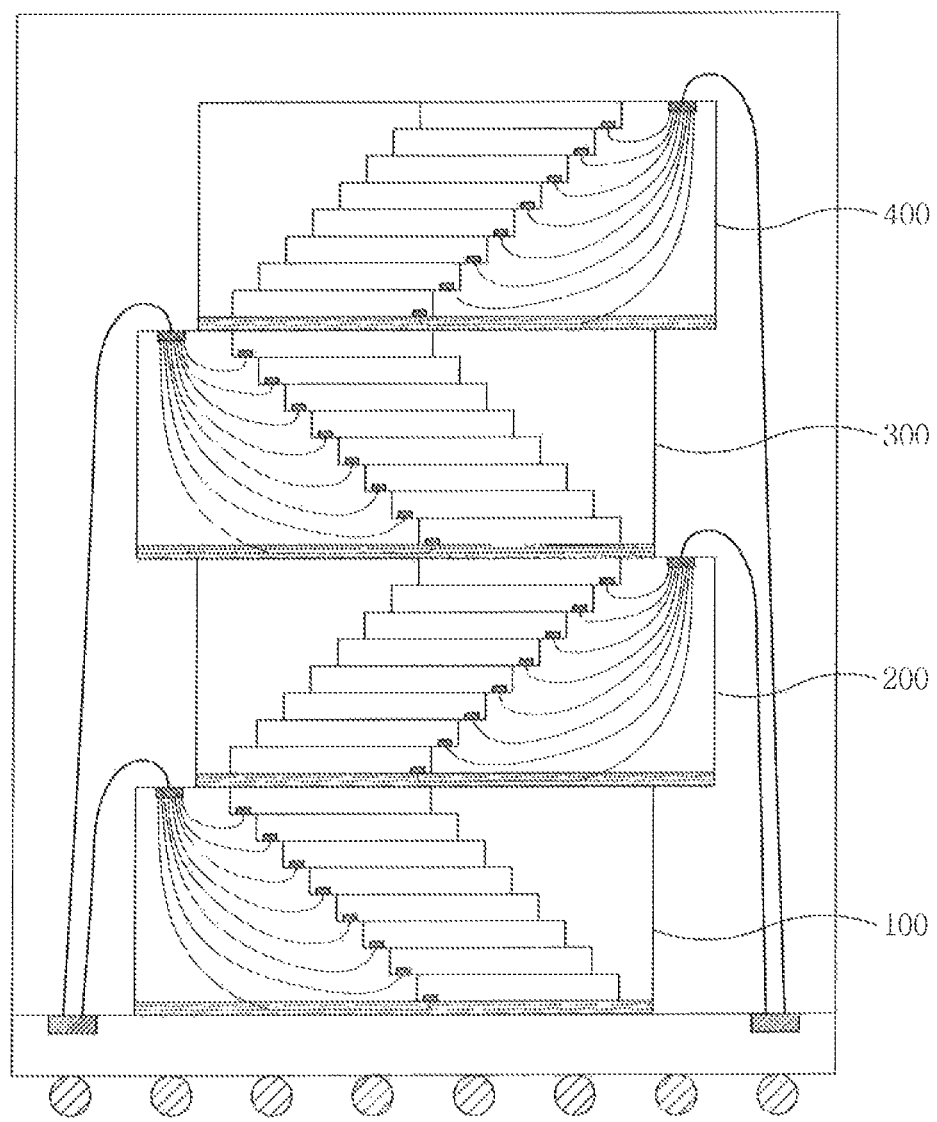

FIG. 8 illustrates a package-on-package 800 in which eight semiconductor chips are mounted in each of unit semiconductor packages 100, 200, 300, and 400. Although FIG. 8 illustrates eight semiconductor chips, the present general inventive concept is not limited thereto, and there may be any number of mounted semiconductor chips. Except for the number of mounted semiconductor chips, the description of the package-on-package 800 may be the same as the package-on-package 600 described above and illustrated in FIG. 6A.

Figure 9:
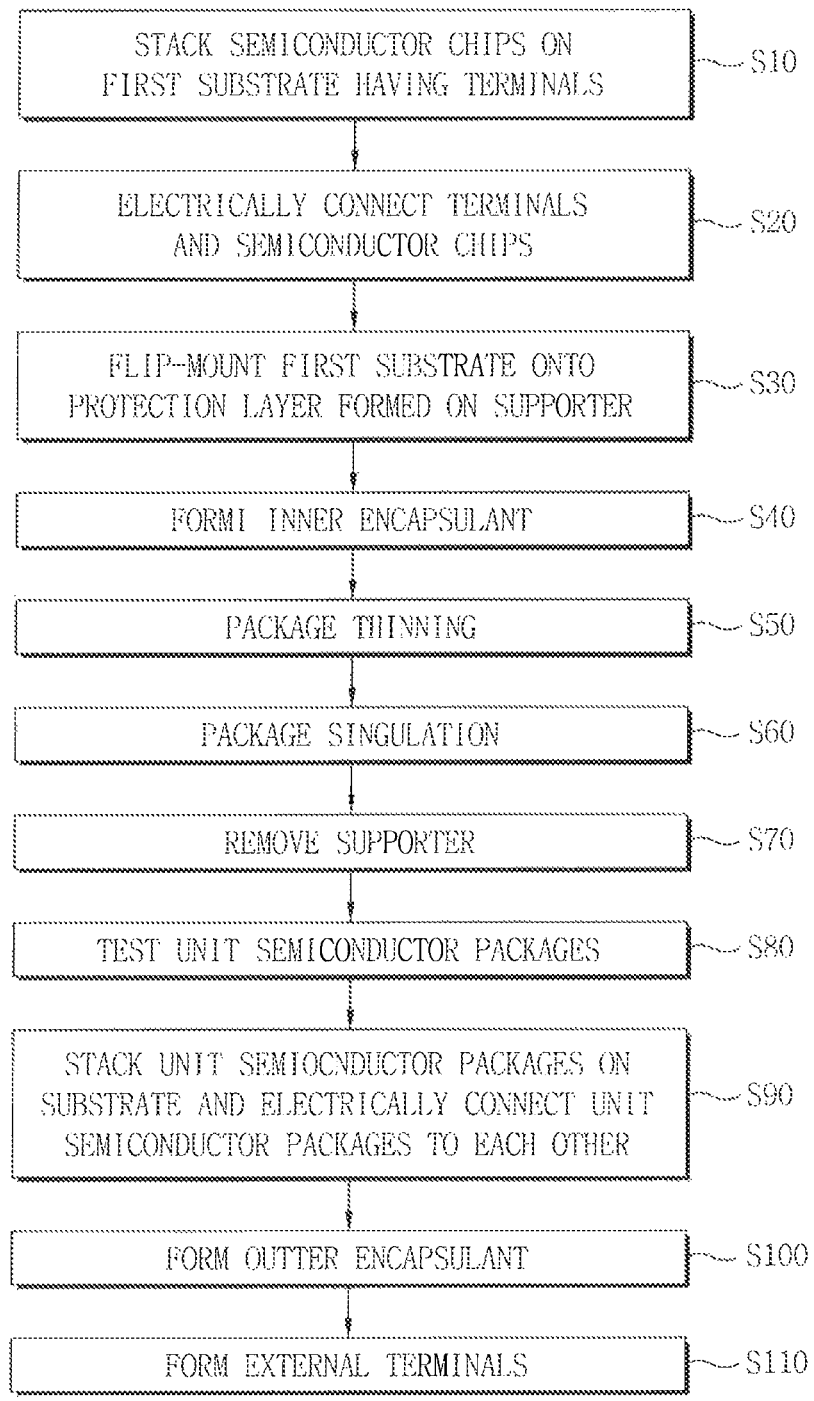
FIG. 9 is a flow chart illustrating a method of fabricating a semiconductor package or a package-on-package in accordance with exemplary embodiments of the present general inventive concept.

FIG. 9 is a flow chart illustrating a method of fabricating a semiconductor package and a package-on-package using the semiconductor package as a unit semiconductor package according to exemplary embodiments of the present general inventive concept. FIGS. 10A to 10J are cross-sectional views illustrating a method of fabricating a semiconductor package or a package-on-package according to exemplary embodiments of the present general inventive concept. In particular, operations S10 to S80 may be a unit semiconductor package fabrication process and operations S90 to S110 may be a package-on-package fabrication process.

Figure 10A:
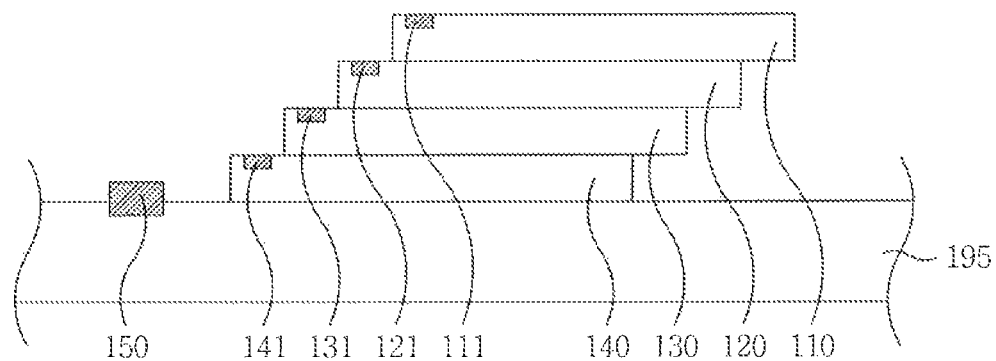

Referring to FIGS. 9 and 10A, the method of fabricating a semiconductor package or a package-on-package according to exemplary embodiments of the present general inventive concept may include sequentially stacking semiconductor chips 140, 130, 120, and 110 on a first substrate 195 which includes terminals 150 disposed on one surface thereof at operation S10. A portion of the terminal 150 may be exposed, and a remaining portion of the terminal 150 may be inserted into the first substrate 195. The semiconductor chips 140, 130, 120, and 110 may be stacked in a cascade pattern or in a staggered zigzag pattern. The number of stacked semiconductor chips may be four or eight, but is not limited thereto, and any suitable number of semiconductor chips may be stacked.

Hereinafter, the unit semiconductor package in which four semiconductor chips are stacked in a cascade pattern will be illustratively explained for clarity. Adhesion layers may be disposed between the semiconductor chips 140, 130, 120, and 110 to adhere the respective semiconductor chips together.

The chip pads 141, 131, 121, and 111 may be disposed on the outer portion of an active surface of each semiconductor chip 140, 130, 120, and 110. The terminals 150 and the chip pads 111, 121, 131, and 141 may include a conductive material. For example, the terminals 150 and the chip pads 111, 121, 131, and 141 may be formed of a metal such as Au, Ag, Cu, Ni, Al, Sn, Pb, Pt, Bi, In, etc.

Figure 10B:
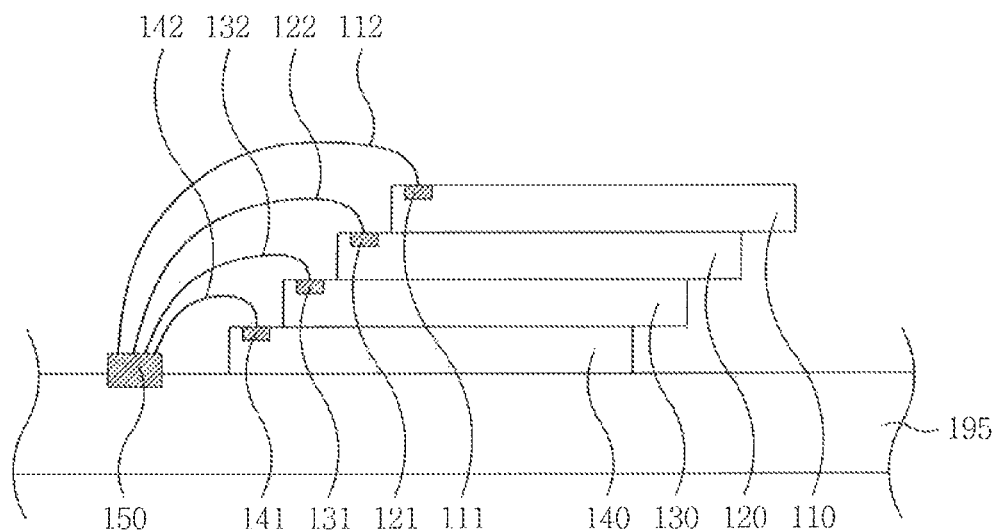

Referring to FIGS. 9 and 10B, the method of fabricating a semiconductor package or a package-on-package according to exemplary embodiments of the present general inventive concept may include electrically connecting the terminals 150 to each chip pad 111, 121, 131, and 141 at operation S20. Operation S20 may include a wire bonding process. At operation 320, the terminals 150 and the chip pads 111, 121, 131, and 141 may be electrically connected by bonding wires 112, 122, 132, and 142. The bonding wires 112, 122, 132, and 142 may include Au wires. The bonding wires 112, 122, 132, and 142 may directly connect the terminals 150 to the chip pads 111, 121, 131, and 141 as illustrated in FIG. 10B. Alternatively, the chip pads of each of upper semiconductor chips may be sequentially connected to the chip pads of each of lower semiconductor chips and the chip pads 111 of the semiconductor chip 110 may be connected to the terminals 150. This will be understood with reference to FIG. 3.

Figure 10C:
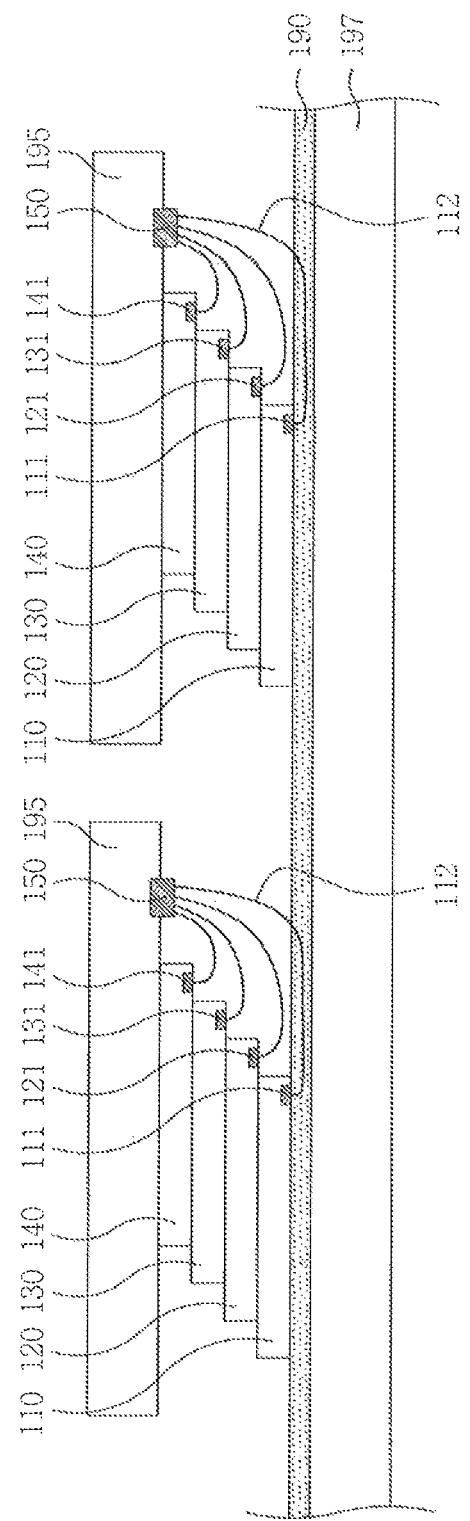

Referring to FIGS. 9 and 10C, the method of fabricating a semiconductor package or a package-on-package may include preparing a supporter 197 having a protection layer 190 disposed on its upper surface, and flip-mounting the first substrate 195 on which the semiconductor chips 140, 130, 120, and 110 are stacked onto the protection layer 190 at operation S30. In operation S30, the uppermost semiconductor chip 110 of FIG. 10B may mounted on the protection layer 190. The semiconductor chip 110 may be called a lowermost semiconductor chip in the unit semiconductor package. Specifically, the active surface on which the chip pads 111 of the semiconductor chip 110 are disposed may be mounted on the protection layer 190.

The protection layer 190 may include a polyimide film. The protection layer 190 may be a tape type having no base film or a paste type to provide double-sided adhesion and to minimize thickness.

The protection layer 190 may have a thickness of 50 to 150 μm. If the thickness of the protection layer 190 exceeds 150 μm, a thickness of the semiconductor package or the following package-on-package may increase, thereby reducing the integration density of the semiconductor device. If the thickness of the protection layer 190 is less than 50 μm, protection of the semiconductor chips 110 and 120, 130, and 140 from external shock or pressure applied in a fabrication process may be reduced. If the thickness of the protection layer 190 is less than 50 μm, a space to bury portions of the bonding wires may be reduced. The protection layer 190 may be hardened together in an outer encapsulant hardening at operation S100. Accordingly, in operation S30, the portions of the bonding wires 112 which electrically connect the lowermost semiconductor chip 110 and the terminals 150 may be at least partially buried in the protection layer 190.

Referring to FIGS. 9 and 10D, the method of fabricating a semiconductor package or a package-on-package according to exemplary embodiments of the present general inventive concept may include forming an inner encapsulant 160 covering the semiconductor chips, the bonding wires, and the first substrate 195 on the protection layer 190 at operation S40. The inner encapsulant 160 may include an EMC.

The process of forming the inner encapsulant 160 may be performed in a wafer unit to cover the plurality of first substrates 195, as illustrated in FIG. 10D.

Figure 10E:
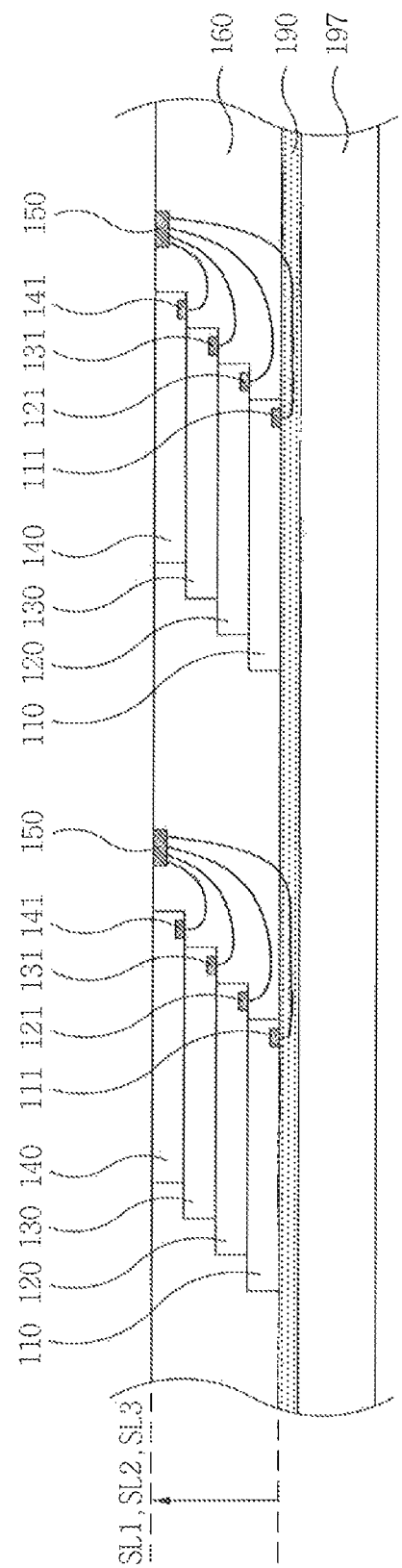

Referring to FIGS. 9 and 10E, the method of fabricating a semiconductor package or a package-on-package according to exemplary embodiments of the present general inventive concept may include a thinning process at operation S50. Operation S50 may include removing a portion of an upper portion of the inner encapsulant 160, as illustrated in FIG. 10E. Portions of the first substrate 195 and the terminals 150 may be removed in operation S50. The package thinning process at operation S50 may include a mechanical grinding process, and a slight chemical grinding process may be included in the package thinning process.

An inactive surface of the uppermost semiconductor chip 140 and upper surfaces of the terminals 150 may be exposed by the package thinning process S50. In further detail, a surface level SL1 of the uppermost semiconductor chip 140, surface levels SL2 of the terminals 150, and a surface level SL3 of the inner encapsulant 160 become level with respect to the protection layer 190.

Figure 10F:
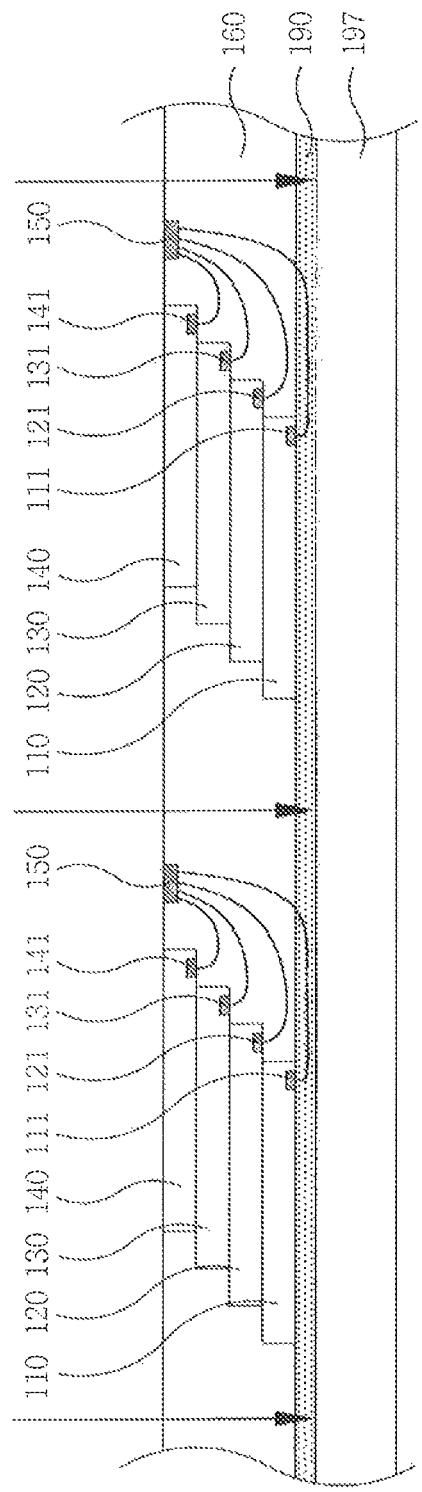

Referring to FIGS. 9 and 10F, the method of fabricating a semiconductor package or a package-on-package according to exemplary embodiments of the present general inventive concept may include a package singulation process at operation S60. The package singulation process at operation S60 may include separating a stack structure of the plurality of semiconductor chips (e.g., by using a sawing wheel or laser) so as to divide the stack structure into each unit semiconductor package. For example, the package singulation process at operation S60 may include cutting the portions of the protection layer 190 indicated by arrows illustrated in FIG. 10F.

Figure 10G:
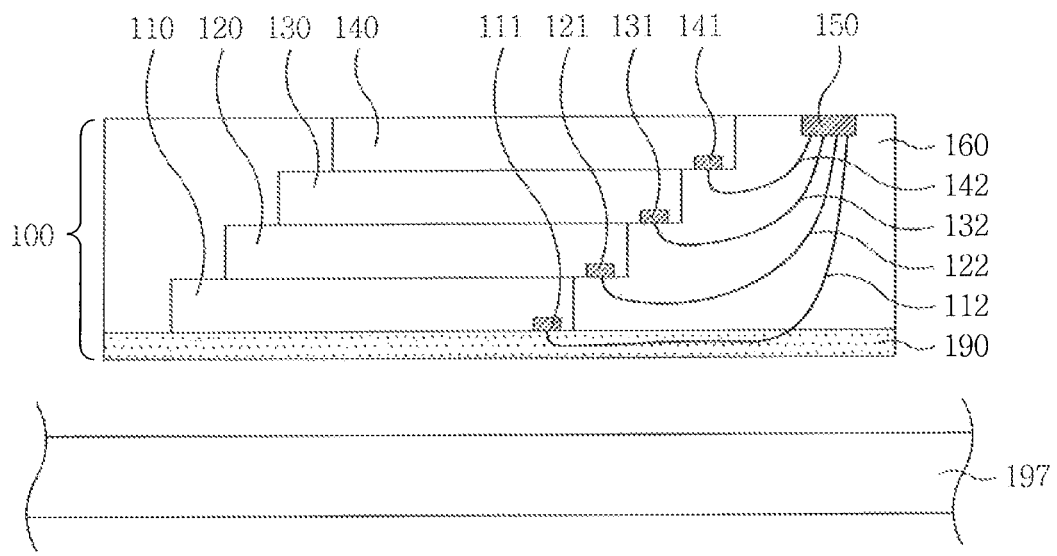

Referring to FIGS. 9 and 10G, the method of fabricating a semiconductor package or a package-on-package according to exemplary embodiments of the present general inventive concept may include removing the supporter 197 at operation S70. For example, operation S70 to remove the supporter 197 may include separating the supporter 197 from the protection layer 190. The operation S70 may include a UV (ultraviolet) radiation or heat treatment process. The adhesion of the protection layer 190 in a contact surface between the protection layer 190 and the supporter 197 can be reduced by the UV radiation or the heat treatment so that the supporter 197 may be detached from the protection layer 190. The unit semiconductor packages 100 may be formed by operation S70 of removing the supporter 197.

The method of fabricating a semiconductor package or a package-on-package according to exemplary embodiments of the present general inventive concept may include testing the unit semiconductor package 100 at operation S80.

The unit semiconductor package 100 may have the terminals 150 exposed. Accordingly, the unit semiconductor package 100 may be tested, for example, by using the terminals 150. Before the package-on-package is fabricated, the unit semiconductor package 100 may be tested. When the unit semiconductor package does not fail, may it be used to fabricate the package-on-package. This may increase fabrication yield compared to when the test process of operation S80 is carried out after the package-on-package is fabricated.

The method of fabricating a package-on-package using the unit semiconductor chips 100 will be described. Herein, the unit semiconductor package 100 may include the semiconductor packages 100a, 100b, 100c, 100d, and 100e as illustrated in FIGS. 1 to 5.

Figure 10H:
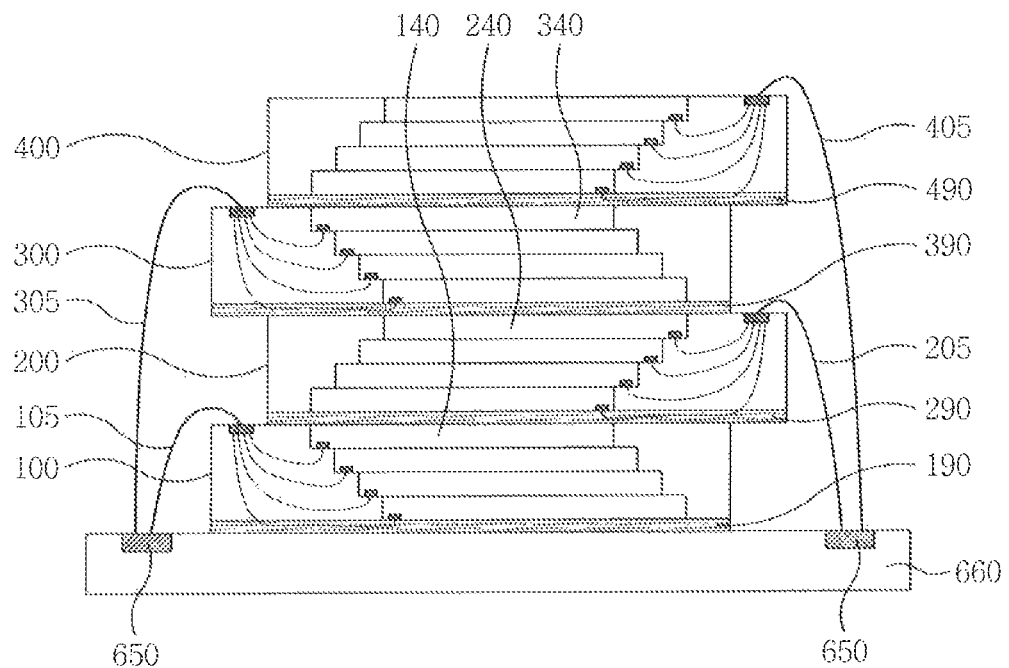

Referring to FIGS. 9 and 10H, the method of fabricating a package-on-package according to exemplary embodiments of the present general inventive concept may include sequentially stacking first to fourth unit semiconductor packages 100, 200, 300, and 400 on a substrate 660 including substrate pads 650, and forming bonding wires 105, 205, 305, and 405 which electrically connect the first to fourth unit semiconductor packages 100, 200, 300, and 400 to the substrate pads 650 at operation S90.

For example, the first to fourth unit semiconductor packages 100, 200, 300, and 400 may be stacked in a staggered zigzag pattern as illustrated in FIG. 10H or stacked in a cascade pattern.

The inactive surfaces of the uppermost semiconductor chips 140, 240, and 340, out of the semiconductor chips included in each of the first to third unit semiconductor packages 100, 200, and 300, may be in contact with the protection layers 290, 390, and 490 of the second to fourth unit semiconductor packages 200, 300, and 400, which are disposed on the first to third unit semiconductor packages 100, 200, and 300. The substrate 660 may be in contact with the protection layer 190 of the first unit semiconductor package 100.

The substrate pads 650 may be formed of a conductive material. For example, the substrate pads 650 may include a metal such as Au, Ag, Cu, Ni, Al, Sn, Pb, Pt, Si, In, etc. The substrate 660 may include at least one of a rigid PCB, a flexible PCB, a rigid flexible PCB, a tape distribution substrate, a ceramic substrate, and a combination thereof.

Figure 10I:
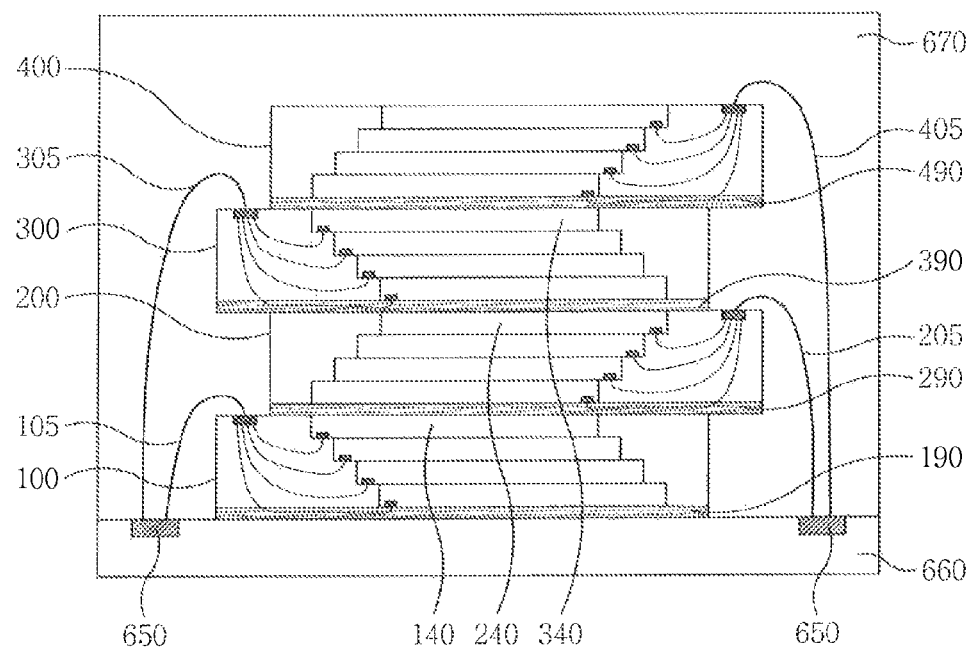

Referring to FIGS. 9 and 10I, the method of fabricating a package-on-package according to exemplary embodiments of the present general inventive concept may include forming an outer encapsulant 670 on the substrate 660 at operation S100. The outer encapsulant 670 may be formed around the unit semiconductor packages 100, 200, 300, and 400, and the bonding wires 105, 205, 305, and 405. The outer encapsulant 670 may protect the unit semiconductor packages 100, 200, 300, and 400, and the bonding wires 105, 205, 305, and 405, from external shock. The outer encapsulant 670 may include an EMC. In the process of hardening the outer encapsulant 670, the protection layer 190 may also be hardened. The protection layer 190 can be hardened to have suitable adhesion and mechanical intensity.

Figure 10J:
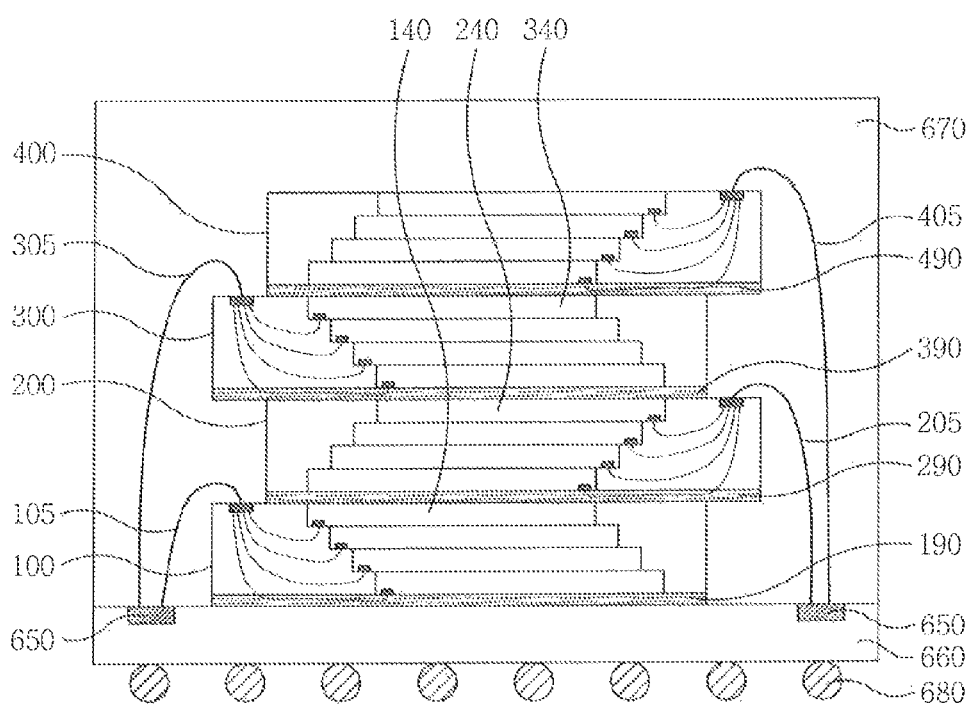

Referring to FIGS. 9 and 10J, the method of fabricating a package-on-package may include forming external terminals 680 on a lower surface of the substrate 660 at operation S110. The external terminals 680 may include at least one of a solder ball, a conductive pump, a conductive tap, a conductive pin, a conductive lead, and a combination thereof.

Figure 11:
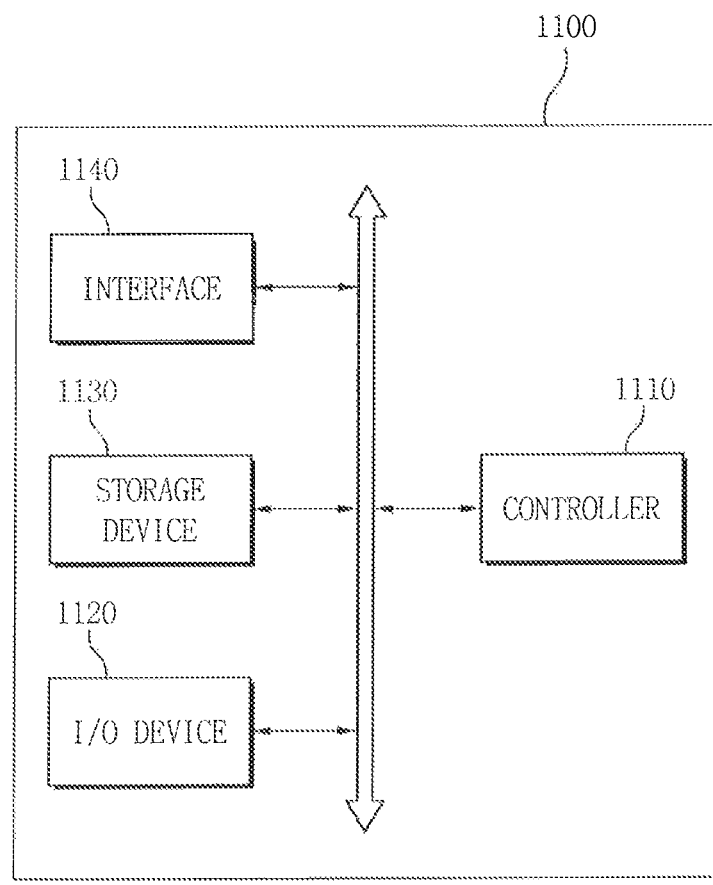
FIG. 11 is a schematic view of an electronic system in accordance with exemplary embodiments of the present general inventive concept.

FIG. 11 is a construction diagram illustrating an electronic system according to exemplary embodiments of the present general inventive concept.

Referring to FIG. 11, an electronic system 1100 according to the present general inventive concept may include a controller 1110, an input/output (I/O) device 1120, a storage device 1130, an interface 1140, and a bus structure 1150. The storage device 1130 may include semiconductor packages 100*a*, 100*b*, 100*c*, 100*d*, and 100*e* or the package-on-package 600, 700, and 800 similar to the semiconductor packages as described above in connection with FIGS. 1 to 10. The bus structure 1150 may be a communication path to transfer data with the controller 1110, the I/O device 1120, the storage device 1130, and the interface 1140.

The controller 1110 may include at least one of at least one microprocessor, a digital signal processor, a microcontroller, and logic devices (e.g., a programmable logic device and/or field programmable gate array), or any suitable controller to carry out the exemplary embodiments of the present general inventive concept disclosed herein. The I/O device 1120 may include at least one keypad, a keyboard, a display device, etc. The storage device 1130 may be a storage medium to store data and/or commands that may be retrieved and/or executed by the controller 1110.

The storage device 1130 may include a volatile memory chip such as a DRAM (Dynamic Random Access Memory) and a static RAM (SRAM), a non-volatile memory chip such as a flash memory, a phase change memory, an MRAM, or a resistive RAM (RRAM) or a combination thereof.

The interface 1140 may transfer data to a communication network or receiving data from the communication network. The interface 1140 may be a wired and/or wireless type. For example, the interface 1140 may include an antenna, a wired-wireless transceiver, etc. The electronic system 1100 may include an application chipset (e.g., an Application Specific Integrated Circuit), a camera image processor (CIS), an I/O device, etc.

The electronic system 1100 may be included in a mobile system, a personal computer, an industrial computer, a logic system which performs various functions, etc. For example, the mobile system may include any one of a personal digital assistant (PDA), a portable computer, a web tablet, a mobile phone, a wireless phone, a laptop computer, a memory card, a digital music system and an information transmission/reception system. When the electronic system 1100 is a wireless communicable apparatus, the electronic system 1100 may be used in a communication system such as code division multiple access (CDMA), global system for mobile communication (GSM), North American digital cellular (NADC), enhanced-time division Multiple access (E-TDMA), wideband code division multiple access (WCDAM), and CDMA100b0.

According to exemplary embodiments of the present inventive concept, molding gaps may be reduced and/or eliminated such that the height of a semiconductor package can be minimized and/or reduced, and the number of semiconductor chips mounted on a unit volume can be maximized and/or increased. The volume of a package-on-package can be reduced so as to increase the density of semiconductor devices. The performance of the unit semiconductor package may be tested to maximize and/or increase the yield of the package-on-package.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the exemplary embodiments disclosed, and that modifications to the disclosed exemplary embodiments, as well as other embodiments, are intended to be included within the scope of the appended claims.

What is claimed is:

1. A semiconductor package, comprising:
   a protection layer;
   a plurality of semiconductor chips stacked on one another, with the stack disposed on the protection layer;
   an inner encapsulant disposed on the protection layer to surround side surfaces of the semiconductor chips; and
   a terminal disposed to be buried in an upper portion of the inner encapsulant,
   wherein each of the semiconductor chips includes an active surface, an inactive surface opposite to the active surface, and a chip pad disposed on a portion of the active surface,
   wherein an upper surface of the terminal is exposed from an upper surface of the inner encapsulant, and wherein the active surface of a lowermost semiconductor chip out of the plurality of semiconductor chips is in contact with the protection layer.

2. The semiconductor package according to claim 1, wherein the chip pad and the terminal are electrically connected by a bonding wire disposed within the inner encapsulant, and the bonding wire is in contact with a lower surface of the terminal.

3. The semiconductor package according to claim 2, wherein a bonding wire which electrically connects the chip pad of a lowest semiconductor chip out of the plurality of semiconductor chips and the terminal is partially buried in the protection layer.

4. The semiconductor package according to claim 1, further comprising:
adhesion layers disposed between the semiconductor chips.

5. The semiconductor package according to claim 1, wherein the inactive surface of an uppermost semiconductor chip out of the plurality of semiconductor chips, the upper surface of the inner encapsulant, and the upper surface of the terminal have the same surface level.

6. The semiconductor package according to claim 1, wherein the plurality of semiconductor chips are stacked in a cascade pattern or in a staggered zigzag pattern.

7. The semiconductor package according to claim 1, wherein the protection layer comprises a polyimide film.

8. The semiconductor package according to claim 1, wherein the protection layer has a thickness of 50 µm to 150 µm.

9. The semiconductor package according to claim 1, wherein the inactive surfaces of the semiconductor chips which are disposed at lower portions of the semiconductor package and the active surfaces of the semiconductor chips which are disposed at upper portions of the semiconductor package are adjacent to each other.

10. A package-on-package, comprising:
a substrate including substrate pads;
a plurality of unit semiconductor packages stacked on one another, with the stack disposed on the substrate; and
an outer encapsulant surrounding side surfaces of the unit semiconductor packages,
wherein each of the unit semiconductor packages includes:
a protection layer;
a plurality of semiconductor chips stacked on one another, with the stack disposed on the protection layer;
an inner encapsulant disposed on the protection layer to surround side surfaces of the semiconductor chips; and
a terminal disposed to be buried in an upper portion of the inner encapsulant,
wherein each of the semiconductor chips includes an active surface, an inactive surface opposite to the active surface, and a chip pad disposed on a portion of the active surface,
wherein an upper surface of the terminal is exposed from an upper surface of the inner encapsulant, and
wherein the active surface of a lowermost semiconductor chip out of the plurality of semiconductor chips is in contact with the protection layer.

11. The package-on-package according to claim 10, wherein the terminals of the unit semiconductor packages are electrically connected to the substrate pads by bonding wires.

12. The package-on-package according to claim 10, wherein the unit semiconductor packages are stacked in a cascade pattern or in a staggered zigzag pattern to expose the terminals.

13. The package-on-package according to claim 10, wherein the outer encapsulant covers an upper portion of an uppermost unit semiconductor package of the unit semiconductor packages.

14. The package-on-package according to claim 10, wherein the substrate further comprises:
an external terminal selected from the group consisting of a solder ball, a conductive bump, a conductive tap, a conductive pin, a conductive lead, and a combination thereof.

15. A semiconductor package, comprising:
a protection layer;
a plurality of semiconductor chips, each having a chip pad;
wherein the plurality of semiconductor chips are stacked on one another so that the chip pads of each respective semiconductor chip are exposed, with the stack of the plurality of semiconductor chips disposed on the protection layer,
wherein bonding wires electrically connect the chip pads to a terminal that is exposed on an outer surface of the semiconductor package,
wherein each of the semiconductor chips includes an active surface, an inactive surface opposite to the active surface, and the chip pads of each of the plurality of semiconductor devices are disposed on a portion of the active surface, and
wherein the active surface of a first semiconductor chip of the plurality of semiconductor chips in the stack is in contact with the protection layer.

16. The semiconductor package of claim 15, further comprising:
an encapsulant disposed on the protection layer to cover at least one surface of the plurality of semiconductor chips.

17. The semiconductor package of claim 16, wherein the encapsulant exposes a top surface of the plurality of semiconductor chips.

* * * * *